(12) United States Patent
Nguyen et al.

(10) Patent No.: US 8,483,500 B2
(45) Date of Patent: Jul. 9, 2013

(54) RUN LENGTH CODING WITH CONTEXT MODEL FOR IMAGE COMPRESSION USING SPARSE DICTIONARIES

(75) Inventors: Thai-Ha Nguyen, San Jose, CA (US); Ali Tabatabai, Cupertino, CA (US)

(73) Assignee: Sony Corporation, Tokyo (JP)

( * ) Notice: Subject to any disclaimer, the term of this patent is extended or adjusted under 35 U.S.C. 154(b) by 265 days.

(21) Appl. No.: 12/962,638

(22) Filed: Dec. 7, 2010

(65) Prior Publication Data

US 2012/0057799 A1 Mar. 8, 2012

Related U.S. Application Data

(60) Provisional application No. 61/379,686, filed on Sep. 2, 2010.

(51) Int. Cl.
*G06K 9/36* (2006.01)
*G06K 9/46* (2006.01)

(52) U.S. Cl.
USPC ........... 382/245; 382/246; 382/247; 382/253; 382/232

(58) Field of Classification Search
None
See application file for complete search history.

(56) References Cited

U.S. PATENT DOCUMENTS

| | | | | |
|---|---|---|---|---|
| 5,136,374 A | * | 8/1992 | Jayant et al. | 375/240.11 |
| 5,371,544 A | * | 12/1994 | Jacquin et al. | 375/240.11 |
| 5,640,159 A | * | 6/1997 | Furlan et al. | 341/51 |
| 6,856,701 B2 | | 2/2005 | Karczewicz et al. | |
| 7,088,271 B2 | | 8/2006 | Marpe et al. | |
| 7,496,143 B2 | | 2/2009 | Schwarz et al. | |
| 2006/0176953 A1 | | 8/2006 | Mohsenian | |
| 2006/0262876 A1 | | 11/2006 | LaDue | |
| 2007/0091997 A1 | | 4/2007 | Fogg et al. | |
| 2010/0119169 A1 | | 5/2010 | Haddad et al. | |
| 2010/0142829 A1 | * | 6/2010 | Guleryuz et al. | 382/209 |

OTHER PUBLICATIONS

Pamela C. Cosman et al. "Vector Quantization of Image Subbands: A Survey". IEEE Transactions on Image Processing, vol. 5, No. 2, Feb. 1996.*
Nasrabadi, N.M. King, R.A., "Image coding using vector quantization: a review", IEEE Transactions onCommunications, 1988, vol. 36, Issue: 8, pp. 957-971.*
United States Patent and Trademark Office (USPTO), International Search Report and Written Opinion issued on Dec. 8, 2011 with claims searched, related PCT International Patent Application No. PCT/US11/045291, pp. 1-10.
Zhang, L. et al—"Context-based Arithmetic Coding Reexamined for DCT Video Compression"—IEEE Int. Symposium on Circuits and Systems, May 27-30, 2007, New Orleans, LA, pp. 3147-3150.
Tu, C. et al.—"Adaptive Runlength Coding"—IEEE Signal Processing Letters, vol. 10, No. 3, Mar. 2003, pp. 61-64.

(Continued)

*Primary Examiner* — Li Liu
(74) *Attorney, Agent, or Firm* — John P. O'Banion

(57) ABSTRACT

Apparatus and methods for coding images geometric vector quantization (GVQ) having an over-complete dictionary which produces a sparse vector of coefficients as it contains large runs of zeros. The sparse encoding is particularly well suited for use with run-length entropy coding techniques. Image blocks are sparse coded using GVQ, with the vector of coefficients converted to RUN-LENGTH symbols, and binarized into a set of binary symbols. At least a portion of the binary symbols are used as contexts which can be selected when performing binary arithmetic coding of the binary coded RUN and LENGTH data to generate a bit stream containing the encoded image that provides enhanced compression.

20 Claims, 12 Drawing Sheets

OTHER PUBLICATIONS

Marpe, D et al.—"Context-Based Adaptive Binary Arithmetic Coding in the H.264/AVC Video Compression Standard"—IEEE Transactions on Circuits and Systems for Video Technology, vol. 13, No. 7, Jul. 2003, pp. 620-636.

Marpe, D. et al.—"Further Results for CABAC entropy coding scheme"—ITU-Telecommunications Standardization Sector, Study Group 16, Question 6, Video Coding Experts Group, Thirteenth Meeting, Austin, TX, Apr. 2-4, 2001, 8 pages.

* cited by examiner

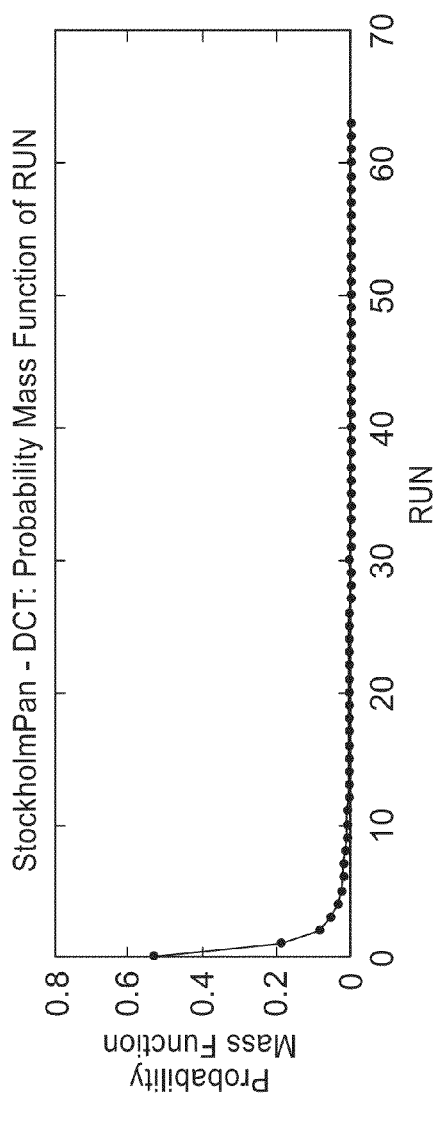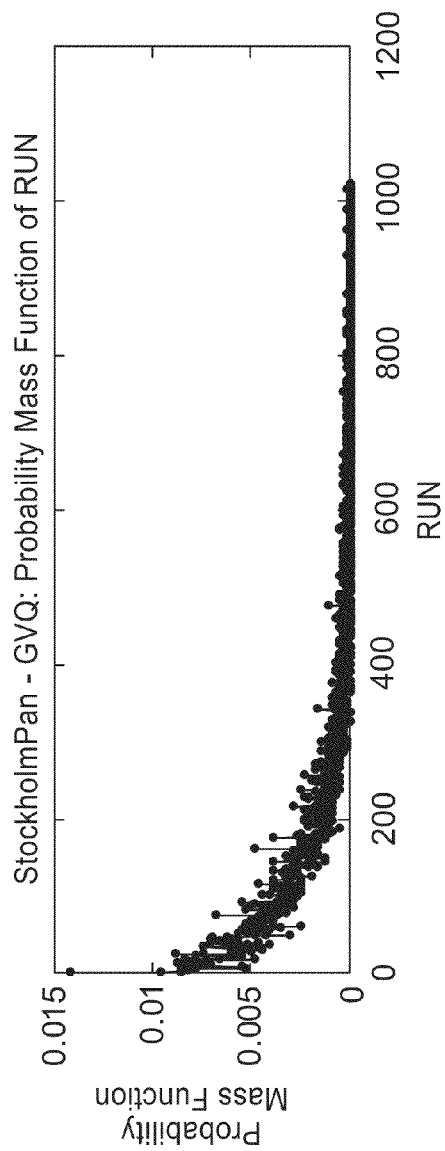
FIG. 11A
FIG. 11B

RUN LENGTH CODING WITH CONTEXT MODEL FOR IMAGE COMPRESSION USING SPARSE DICTIONARIES

CROSS-REFERENCE TO RELATED APPLICATIONS

This application claims priority from U.S. provisional application Ser. No. 61/379,686 filed on Sep. 2, 2010, incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to image compression, and more particularly to run-length entropy coding using over-complete dictionaries.

2. Description of Related Art

In a world which increasingly depends on multimedia communications, the ability to further compress image data while retaining image accuracy is highly sought after. The process of image compression is the application of data compression methods to digital images, toward encoding information using fewer data bits than required by an unencoded representation.

As with any communication, there is no benefit to be gained unless both the sender and receiver of the information understand the encoding scheme. Thereby, compressed data can only be understood if the decoding method is known by the receiver.

Compression is beneficial as it helps reduce the consumption of expensive resources, including hard disk space or transmission bandwidth. On the downside, compressed data must be decompressed to be used, and this extra processing may be detrimental to some applications. For instance, a compression scheme for video may require expensive hardware for the video to be decompressed at a sufficiently fast rate to allow viewing in real time as it is being decompressed. Data compression techniques often require trade-offs among various factors, including the degree of compression, the amount of distortion introduced in lossy compression schemes, and the computational resources required to compress and uncompress the data.

Entropy coding is a special form of lossless data compression which typically involves arranging image components in a "zigzag" order employing a run-length encoding (RLE) algorithm that groups similar frequencies together, inserting length coding zeros, and then using Huffman coding, arithmetic coding, or similar on the remaining coefficients.

Run Length Encoding (RLE) is a lossless encoding mechanism which is useful for reducing the size of a binary data stream containing runs of duplicate values, in particular for reducing the bits necessary for encoding a run of zero coefficients. It would be beneficial, however, to be able to perform run-length coding (RLE) with fewer bits than presently required.

Accordingly, a need exists for a system and method of sparse image encoding which can be more efficiently run length encoded. These needs and others are met within the present invention, which overcomes the deficiencies of previously developed encoding systems and methods.

BRIEF SUMMARY OF THE INVENTION

An apparatus and method describes run length encoding of coefficient data from images compressed using sparse dictionaries. Sparse coding is performed in the present invention, such as in response to a Geometric Vector Quantization (GVQ), which utilizes an over-complete dictionary and outputs a set of coefficients that are more sparse than that provided when quantizing according to Discrete Cosine Transforms (DCT).

Sparse coding refers to the generation of a vector of coefficients which contain more frequent runs of zeros than found in the DCT output. A run length coding scheme is then utilized which mitigates the effect of the dictionary over-completeness. The DC value and RUN-LENGTH pairs do not have the frequency relationships provided by DCT. The vector of coefficients from the sparse coding is converted to symbols in a desired RUN/LEVEL format and the symbols mapped into binary symbols called 'bins'. The coding process preferably utilizes an appropriate context model which is selected for use during binary arithmetic coding and from which an encoded bit stream is generated. In one implementation one context model is used for each of the bins. In addition, in at least one implementation according to the present invention, an ordering of dictionary atoms is utilized in response to their appearance frequency in the training process. The inventive apparatus and method obtains results which are comparable to state-of-the-art entropy coding techniques, and coupled with sparse representation methods can provide enhanced output with respect to JPEG image compression.

The invention is amenable to being embodied in a number of ways, including but not limited to the following descriptions.

One embodiment of the invention is an apparatus for encoding image blocks from images, comprising: (a) a sparse coder configured for geometric vector quantization (GVQ) of an image block, having a number of pixels, from an input image in response to selecting a pattern from a finite set of geometric patterns contained in a dictionary, and generating a number of coefficients within a vector of coefficients representing the image block; wherein the number of coefficients within the vector of coefficients exceeds the number of pixels in the image block in response to sparse decompositions of the image block arising from utilizing the dictionary which is over-complete; (b) a run-length coder configured for converting said vector of coefficients to symbols which are arithmetically coded into a bit stream output.

The finite set of geometric patterns are based on edge-related features detected in a training set and contained in the over-complete dictionary. The dictionary of patterns is over-complete as the set of geometric patterns within it exceeds the size of an image block. The patterns are arranged in the dictionary according to frequency of appearance in the image block and not in response to an image signal frequency relationship, as one would find in a dictionary according to DCT encoding which follows a zig-zag pattern. The encoding provides a higher percentage of zero coefficients in response to GVQ that arise when coding according to a discrete cosine transform (DCT).

At least one embodiment of the sparse coder according to the invention can be configured for binarizing RUN symbols using a first bit state to represent an End-of-Block condition, and a second bit state to precede a RUN state value having a fixed number of binary bits proportional to the expected zero run length within the image, such as from 8 to 12 bits, or more preferably 10 bits, which represent RUN length as a binary number. It will be appreciated, however, that any desired run-length coding scheme can be utilized according to aspects of the present invention.

At least one embodiment of the invention makes use of a context model which (a) predicts non-zeros as a number of value N; (b) utilizes each the context model the binary arithmetic coding (BAC) of a first N−1 RUN values; and then (c) if the prediction of N is incorrect, the same plurality of context models which were utilized when BAC coding of the first N−1 RUN values are also utilized for BAC coding of the RUN values subsequent to N.

One embodiment of the invention is an apparatus for encoding image blocks from received images, comprising: (a) a computer configured for encoding an image; (b) a memory coupled to the computer; and (c) programming executable on the computer for performing a set of steps comprising, (c)(i) dividing the image into a plurality of image blocks, each having a number of pixels, (c)(ii) performing a geometric vector quantization operation on an image block within the plurality of image blocks in response to a finite set of geometric patterns contained within a dictionary, which is over-complete, to generate a sparse coding within a vector of coefficients, (c)(iii) converting said vector of coefficients to symbols, which are arithmetically coded into a bit stream output with respect to using and switching between a plurality of context models.

During geometric vector quantization operation a pattern is preferably selected from the finite set of geometric patterns contained in the dictionary is utilized in generating a number of coefficients within a vector of coefficients representing the image block. The number of coefficients within the vector of coefficients exceeds that of the image block arising from utilizing the over-complete dictionary. The geometric patterns in the dictionary are based on edge-related features determined in response to a training set and associated procedure.

One embodiment of the invention is a method of encoding image blocks from received images within an image encoding device, comprising: (a) dividing an image into image blocks; (b) performing geometric vector quantization on each image block in response to an over-complete dictionary to generate a sparse coding within a vector of coefficients; and (c) converting said vector of coefficients to symbols which are arithmetically coded into a bit stream output in response to switching between context models.

The present invention provides a number of beneficial elements which can be implemented either separately or in any desired combination without departing from the present teachings.

An embodiment of the invention is an image compression apparatus and/or method utilizing sparse over-complete representations of the image blocks, such as provided by GVQ transforms, and which is particularly well-suited for run length encoding schemes.

Another element of the invention is the ordering of dictionary atoms based on their appearance frequency as determined in the training process, as they do not have the zig-zag ordering as when using DCT transformation.

A still further element of the invention is its applicability to a wide range of coding applications and hardware for use with still and video images.

Further element of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 11A and FIG. 11B are graphs of probability mass function (pmf) comparing RUN coded with DCT and GVQ according to one embodiment of the present invention.

DETAILED DESCRIPTION OF THE INVENTION

Enhanced image compression using a sparse over-complete representation of image blocks is described in which a novel run length entropy coding of transform coefficients is performed.

Figure 1:
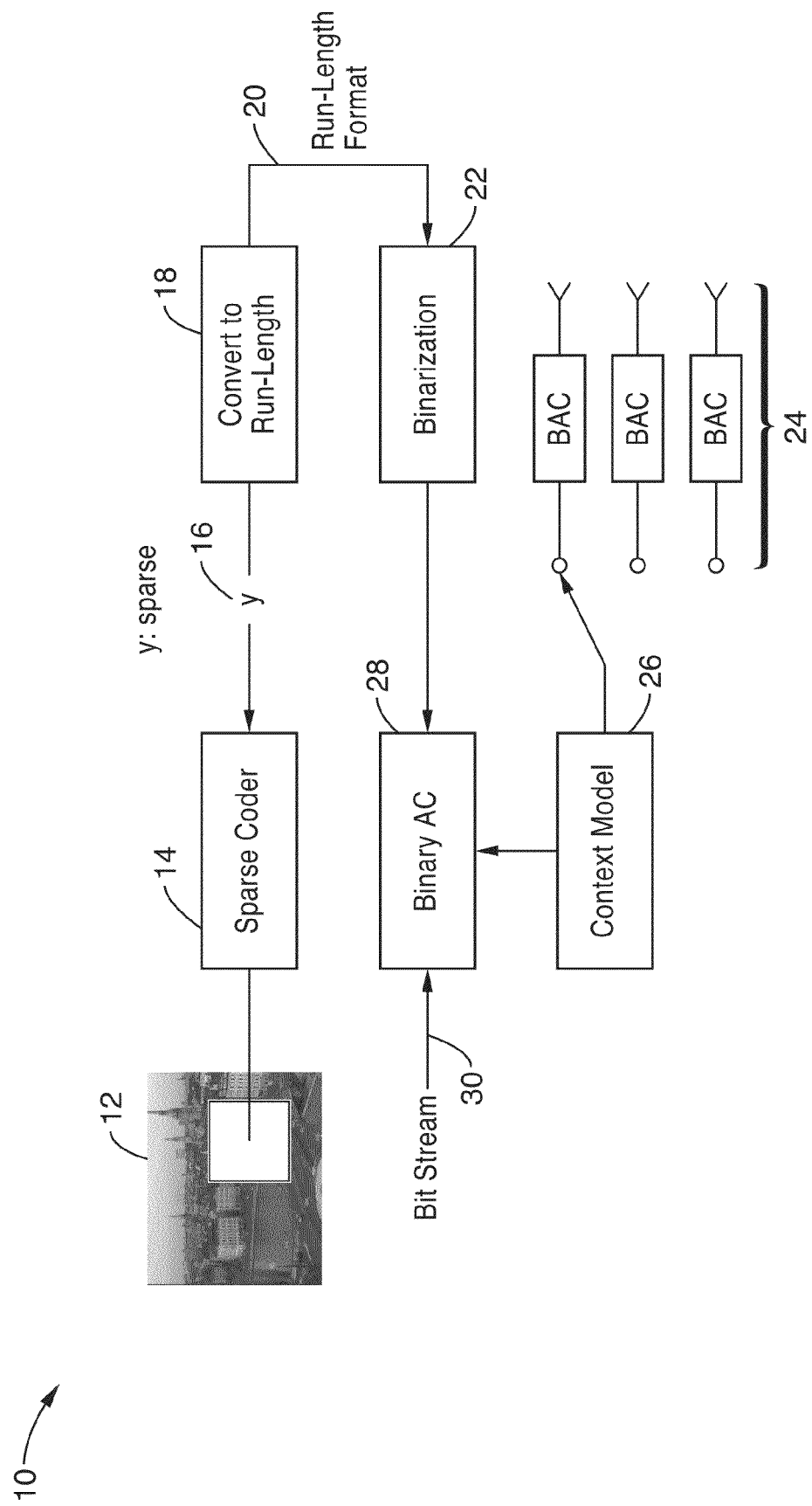
FIG. 1 is a block diagram of sparse coding according to an embodiment of the present invention.

FIG. 1 illustrates an example embodiment 10 of encoding according to the invention. An image is divided into non-overlapping image blocks 12 which are coded independently. Block data is received by a sparse coder 14 which first transforms the blocks using an over-complete dictionary. It will be appreciated that the dictionary is over-complete as it contains more blocks of geometric patterns than the number of blocks found in an image frame, and thus can have more than one unique representation.

By way of example and not limitation, the sparse coder operates according to Geometric Vector Quantization (GVQ), utilizing a set of geometrically patterned atoms from a dictionary.

It will be recognized that in performing vector quantization, one approximates an input random vector Y, by choosing from a finite set of geometric patterns in the dictionary. The more general problem is that one does not have direct access to Y, but only to some statistically related random vector X. Vector X is observed from which an approximation to Y is to be approximated from a codebook of candidate vectors. GVQ takes advantage of the characteristically sparse coding found in the high frequency components and provides a form of quantized estimation.

Geometric Vector Quantization (GVQ) is a vector quantization method where the geometric patterns (also referred to as atoms or code vectors) are inspired by edge related features (e.g., 3×3, 4×4, 8×8 and so forth), with 4×4 or 8×8 being preferable for the majority of applications toward optimizing the tradeoff between coding efficiency versus representation tradeoffs, and contained in a finite set of geometric patterns from a dictionary (also referred to as a library or codebook). The GVQ coder is preferably trained in response to using existing natural images or previous frames in a video. In at least one implementation of the invention, the first atom in the dictionary is forced to be the DC atom, representing the DC coefficient, such that the gain/loss of the coding is provided in response to coding of the RUN and LEVEL coefficients.

As the dictionary is over-complete the number of coefficients which are produced during coding exceeds the number of pixels in the original block. However, the majority of these coefficients will be zero in response to the dictionary being trained to enforced sparsity. The sparse coder generates a vector of coefficients 16 (Y).

The following example describes run-length coding processes by way of example and not limitation. It will be appreciated that the present invention using the GVQ quantization operates beneficially with run length coding but can be coded according to any of a number of desired run-length coding schemes without departing from the teachings of the present invention. A run length coder 18 receives the vector of coefficients 16 and converts this using run length entropy encoding to a RUN/LEVEL format. In the RUN/LEVEL format the vector of coefficients is represented by a DC coefficient, RUN data indicating zero run (span) lengths, and LEVEL data containing non-zero coefficients.

The RUN/LEVEL format follows the general pattern:
 (DC)(RUN)(LEVEL)(RUN)(LEVEL) . . . (RUN)(LEVEL)(EOB)

Example Vector: 937000008004000 is coded as:
DC: 9
RUN: 0052(EOB)
LEVEL: 3784

In studying the above it is seen that the first coefficient is the DC coefficient. Before the first non-zero coefficient (3), there are NO runs of zeros so the first RUN value is (0). Also, there are not any zeros between the first and second non-zero coefficients (3) and (7), wherein the next value of RUN is also (0). Five zeros are found between the second and third non-zero coefficients (7) and (8), thereby the next value of RUN is (5). Two zeros are found between the third and fourth non-zero coefficients (8) and (4), so the next value of RUN is (2). As there are no more non-zero coefficients after the (4), there is no need to indicate the length of this last RUN and an End of Block (EOB) value terminates the sequence. From the above it is readily seen that level positions can be inferred from the prior values of LEVEL and RUN. Accordingly, it will be appreciated that RUN and LEVEL can be divided into separate strings as described above.

Run-length data 20 is then received by a binarization block (or module) 22 to map RUN and LEVEL symbols into a series of 0 and 1 symbols, hereafter referred to as 'bins' (binary-symbols). In association with this binarization process, contexts are defined, such as for each bins, for RUN and LEVEL to provide a plurality of contexts 24. In one aspect of the invention a context model 26 can switch between contexts 24.

In one traditional form of binary run length encoding, the length of the run (R) was represented in binary by (R+1) zeroes followed by a "1" value. For example, a run of two zeros (R=2) is represented by three zeros and a one (0001), one zero (R=1) by two zeros and a one (001), and the absence of zeros (R=0) by a zero and a one (01). The end-of-block (EOB) is represented by a one (1). This form of run-length coding is well-suited for use with non-sparse coding techniques which provide only short runs of zeros.

However, for at least one embodiment of the present invention a binary encoding technique is configured to be properly interoperable with a sparse encoding technique which can produce long runs. In this encoding mechanism the first binary bit defines whether a RUN or an end-of-block (EOB) exists. By way of example and not limitation, an end-of-block (EOB) is defined by a single binary one (1), while the commencement of a RUN is defined by a leading zero (0) followed by a fixed length binary value (e.g., 8-12 binary digits and more preferably 10 binary digits) indicating the length of the run. During decoding if a binary zero is found marking the run, the following 10 bits are evaluated as the length of the run. Conversely, if a one (1) is found in the first position of the run this is considered to be the end of the block. It will be appreciated that using these 10 bits, a run of up to 1024 zero coefficients can be represented. Encoding a run of 1024 using the previous techniques would require R+1 bits, and thus 1025 binary bits for this example run. The invention is configured with the above binarization since the probability mass function is less skewed in comparison to DCT coding. These bins are preferably placed in different context models to improve coding.

Binarization of LEVEL can be performed according to any desired level coding technique. By way of example and not limitation, a sign-value configuration can be used in which the first binary digit represents the sign (e.g., 0=+, 1="−", or the reverse), followed by (m−1) zeros followed by a one (1), in which (m) is the magnitude. Thus, the first bit indicates sign, then the number of zeros up to the next one bit (1) represent the magnitude value. This has the advantage of providing compact values for small entropy magnitudes, which should arise often with a sparse encoder.

The binary symbols, bins, are received by a binary arithmetic coding block (module) 28 using the context model 26 with selectable contexts 24 to generate a bit stream 30.

In typical context modeling the first run is considered separately from the other runs. The first run is considered to be likely a zero (0) or EOB. Three models are used, f=0 if neither the left or top block are flat, f=1 if either of the blocks is flat, while f=2 if both the blocks are flat. The other runs are then modeled into 0, 1 or 2 based on the zig-zag order (l) and magnitude (m) of the previous level in response to the RUN and LEVEL statistics. These, for example, are modeled as follows.

$$(l<6 \text{ and } m=1)$$

$$(l<6 \text{ and } m>1)$$

$$(6 \leq l<15 \text{ and } m=1)$$

$$(6 \leq l<15 \text{ and } m>1)$$

$$(l>15)$$

However, in a sparse coder, such as GVQ, the above modeling cannot be properly utilized as there is not a zig-zag pattern associated with the coefficient vector. In at least one embodiment of the present invention, context modeling is performed in three sections. The DC model can be determined based on the number of non-zero coefficients (N) of the left and top blocks (e.g., f=0, 1, or 2) as in DC modeling. Then in the first (N−1) RUN there is assigned one context model for each of the binary symbols. It should be appreciated that these first bins will be more likely zero (0), as small RUNs occur more frequently. In the other RUNs, if it is predicted that an EOB will arise any time soon, then a new context model is used for the first bin. If the EOB prediction is incorrect, then the other bins will utilize the same context models as the first (N−1) RUN.

Figure 2:
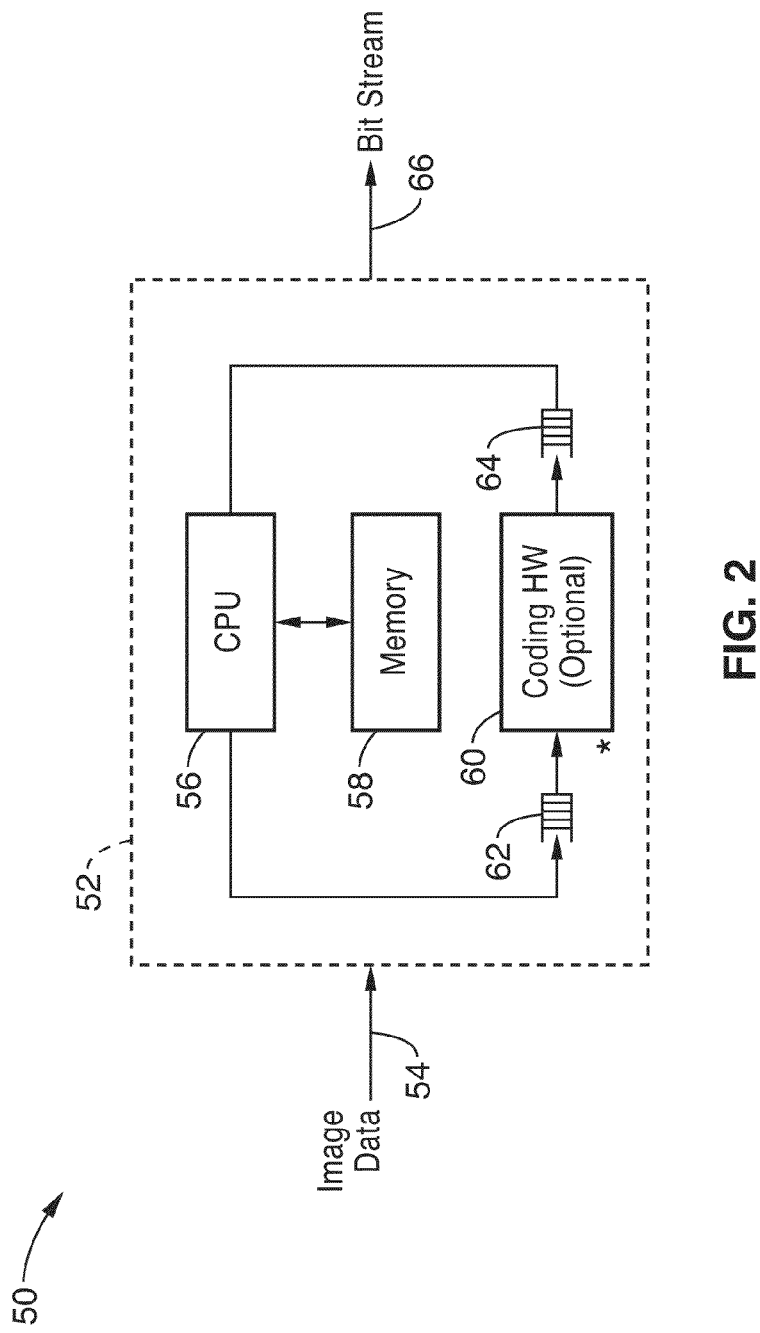
FIG. 2 is a block diagram of sparse coder apparatus according to an embodiment of the present invention.

FIG. 2 is an example embodiment of coding 50 according to the present invention. A coder apparatus 52 is shown receiving image data 54 which is processed by a computer processor (CPU) 56 shown coupled to a memory 58. The coded bit stream 66 is then output from block 52. It should be appreciated that a coding apparatus according to the present invention can be implemented wholly as programming executing on a computer processor, or alternatively as a computer processor executing in combination with acceleration hardware, or solely in hardware, such as logic arrays or large scale integrated circuits. Coding hardware is represented by a block 60 which receives input through a first buffer 62, with output through a second buffer 64. If coding hardware is utilized according to the present teachings, it can be utilized to perform any desired portions of the operations recited in the description, or all of the operations.

Figure 3:
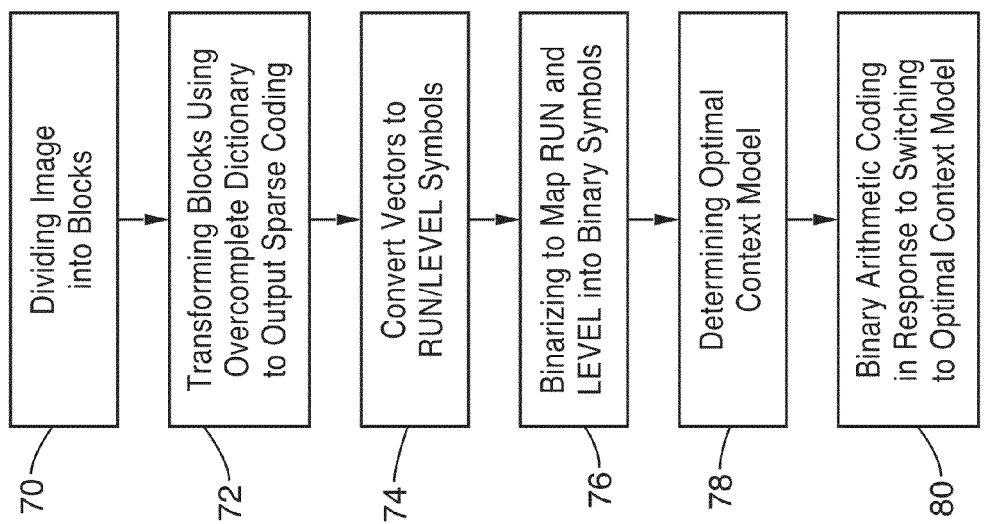
FIG. 3 is a flowchart of sparse coding according to one embodiment of the present invention which is shown used with run length encoding.

FIG. 3 illustrates an example embodiment of the inventive method for run length coding for a sparse encoder. The image is divided 70 into blocks, then transformed 72 using the over-complete dictionary to produce sparse coding within its coefficient vector. The vector is converted 74 using RUN/LENGTH coding into symbols. The symbols are then binarized into a set of binary symbols 76. Contexts are determined 78 during binarization which are utilized for context modeling 80 during binary arithmetic coding in response to switching an optimal context model.

Figure 4:
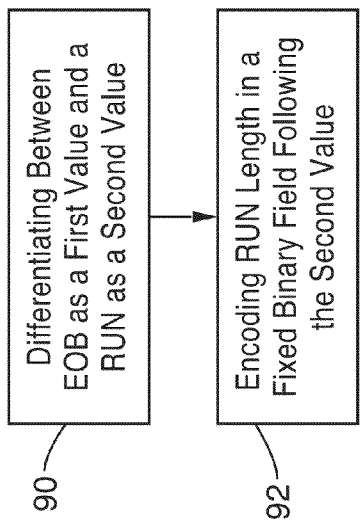
FIG. 4 is a flowchart of binarization RUN length and EOB coding according to at least one run length encoding scheme.

FIG. 4 is an example embodiment of a RUN coding method configured for optimum interoperability with a sparse coder. This is performed by differentiating 90 between EOB and a RUN length in response to the setting of a first bit which can assume a first value (EOB) or a second value (RUN). If the second value indicates a RUN, then a RUN length is encoded 92 following the second value as a fixed length binary field indicating the length of the RUN.

Experiments indicate that the present invention obtains results comparable to state-of-the-art entropy coding techniques, that used together with the sparse representation method, can outperform traditional JPEG image compression technology.

A number of experiments on the sparse encoding technique were performed using GVQ with dictionary training having a number of non-zero atoms for a sparsity of four (4), a total of 1024 atoms, and providing 25 iterations to achieve the desired sparsity. It will be appreciated that sparsity is defined based on certain norm definitions.

Figure 5:
FIG. 5 is an image of Stockholm, referred to as "StockholmPan" used for testing an embodiment of the present invention.

FIG. 5 depicts a test image referred to as "StockholmPan" used in the test results described below.

Figure 6:
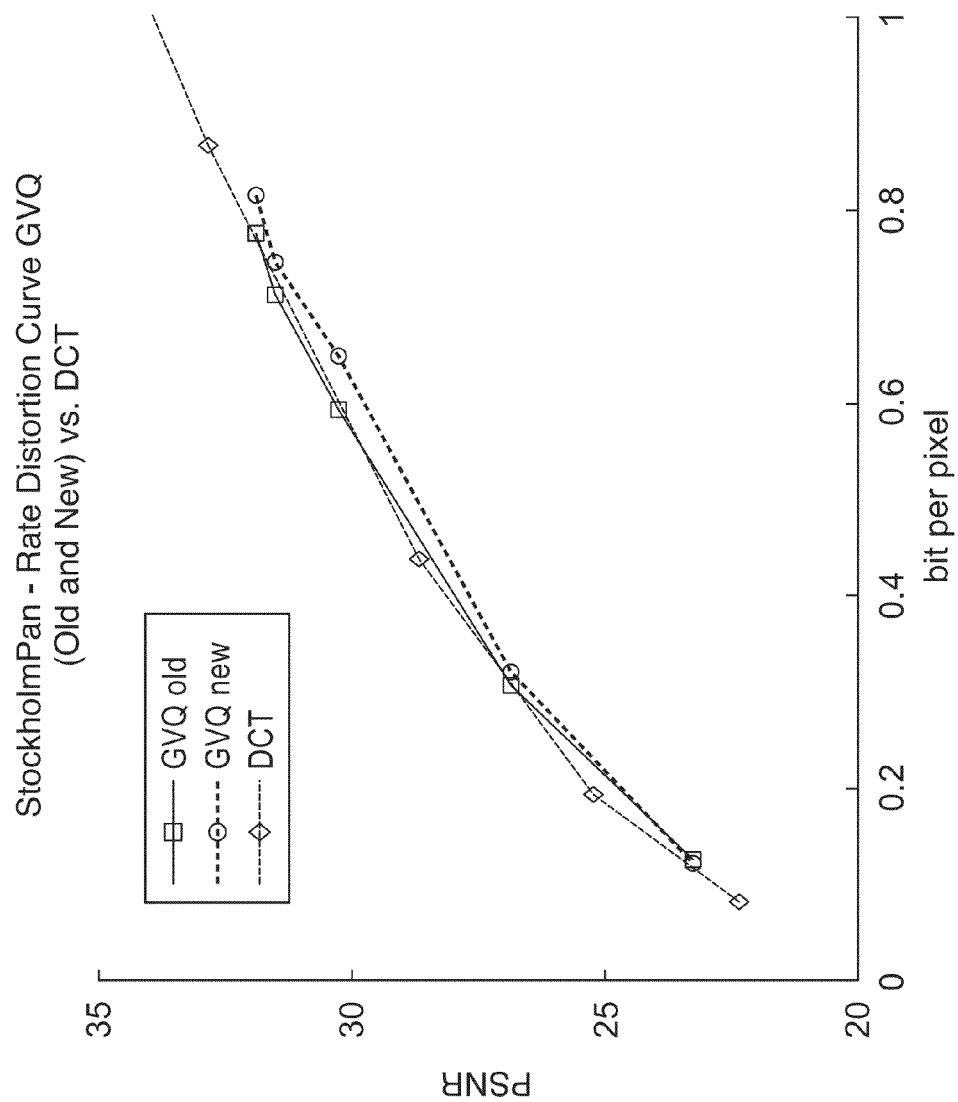
FIG. 6 is a graph of rate distortion of coding the StockholmPan image comparing DCT, conventional GVQ and a GVQ encoding according to one embodiment of the present invention.

FIG. 6 depicts rate distortion of the StockholmPan image comparing DCT, conventional GVQ (old) and a GVQ (new) encoding according to the present invention. It will be seen that the new s GVQ encoding of the invention provides similar rate distortion as the old GVQ and is comparable with DCT encoding.

Figure 7:
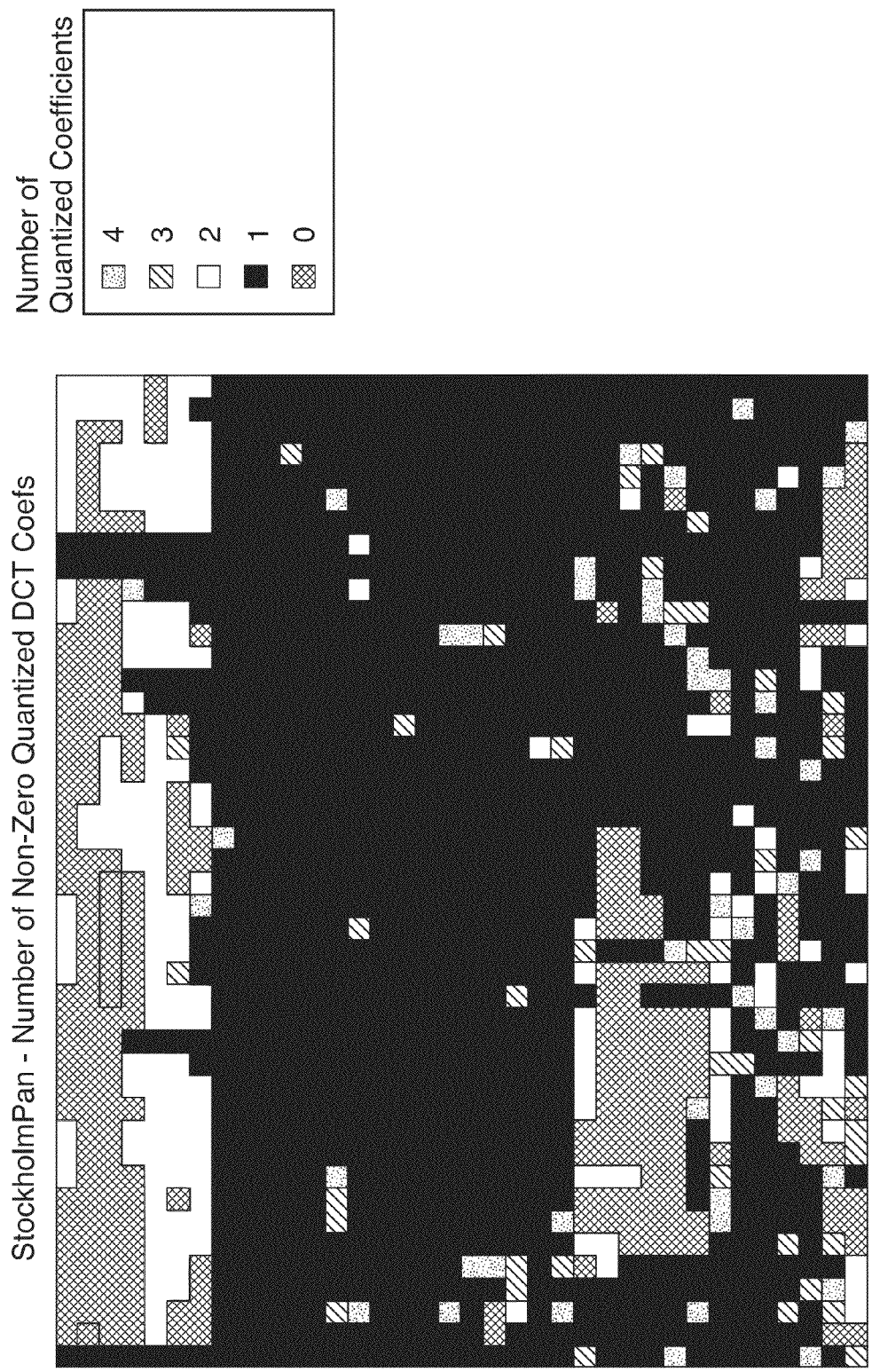
FIG. 7 is a diagram showing the number of non-zero quantized coefficients resulting from DCT encoding.

FIG. 7 depicts the number of non-zero quantized coefficients resulting from DCT encoding, exemplifying zero to four coefficients. The cross-hatched areas indicate zero coefficients, the solid areas 1 coefficient, the blank areas 2 coefficients, the diagonal hatched areas 3 coefficients, and the dotted areas with 4 or more coefficients.

Figure 8:
FIG. 8 is a diagram showing the number of non-zero quantized coefficients resulting from GVQ encoding according to one embodiment of the present invention.

FIG. 8 depicts the number of non-zero quantized coefficients resulting from GVQ encoding according to the present invention, using the same representational legend as shown in FIG. 7. It should be appreciated that the number of zero coefficients has been increased in response to the use of GVQ sparse encoding according to the present invention.

Figure 9:
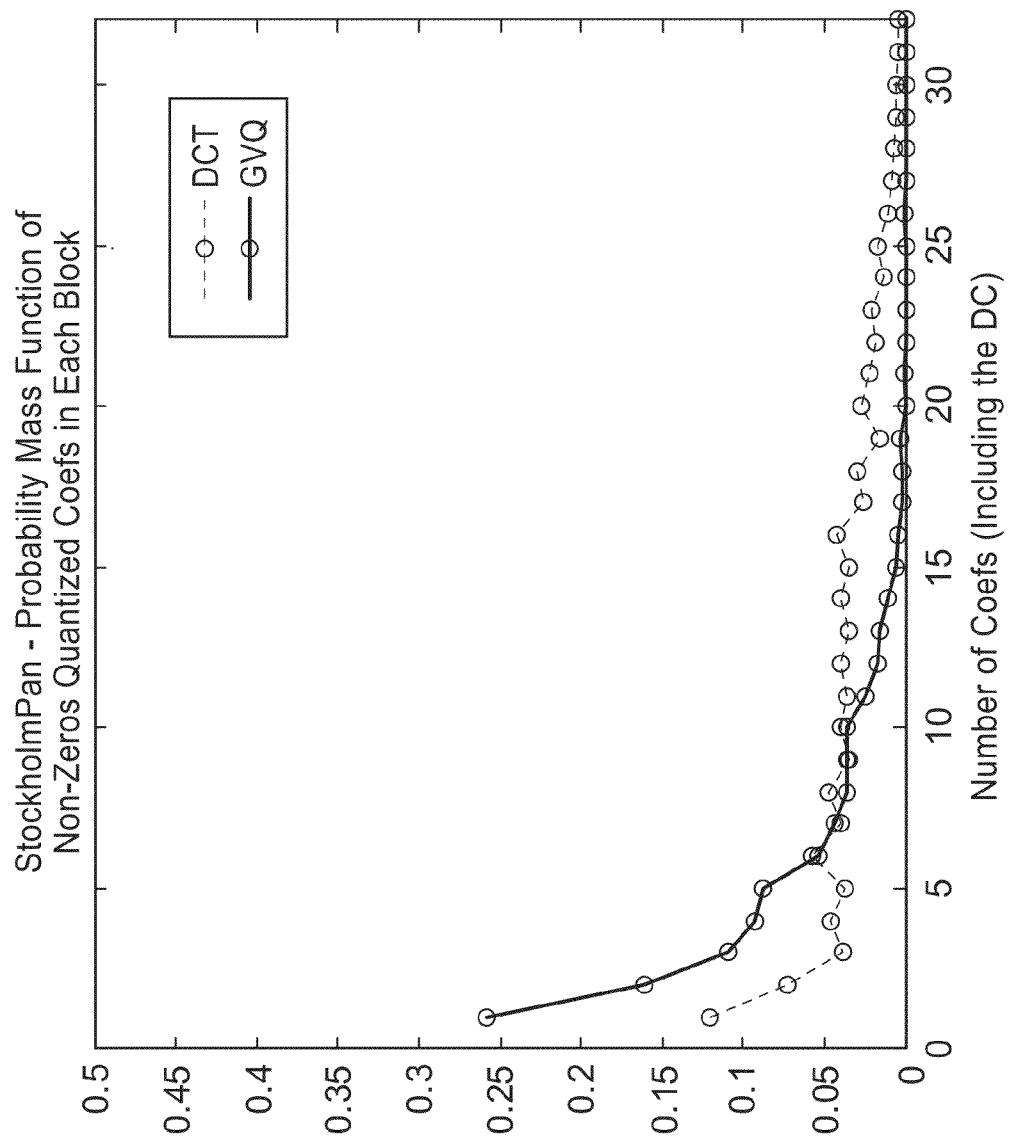
FIG. 9 is a graph of probability mass function (pmf) showing non-zero quantized coefficients in each block comparing DCT and GVQ coding.

FIG. 9 depicts the probability mass function (pmf) of non-zero quantized coefficients in each block compared between DCT and GVQ coding. It will be seen that the non-zero coefficient distributions for GVQ are more concentrated toward the lower number of coefficients in comparison to DCT.

Figure 10:
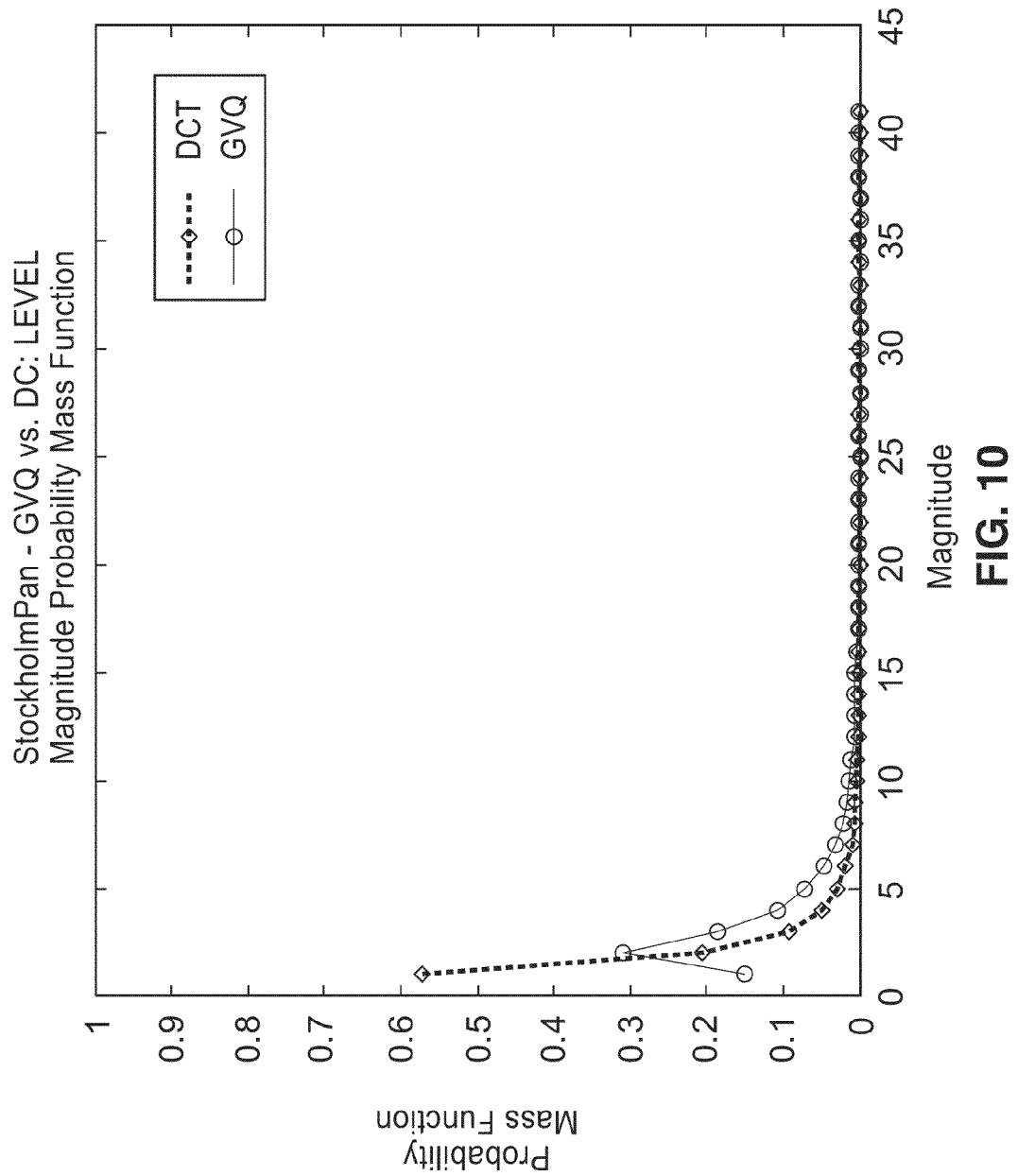
FIG. 10 is a graph of level magnitude probability mass function (PMF) showing LEVEL magnitude with probability mass function (pmf) comparing DCT and GVQ coding.

FIG. 10 depicts probability mass function (pmf) for LEVEL magnitude compared between DCT and GVQ encoding. It is readily noted that the maximum pmf under DCT coding reaches almost 0.6, while it is just over 0.3 for the GVQ encoding according to the invention.

FIG. 11A and FIG. 11B compare probability mass function (pmf) for a RUN coded with DCT and GVQ according to the present invention. The significantly larger runs and lower pmf values can be readily observed. The maximum pmf under DCT coding reaches nearly 0.6, while is it under 0.015 for the GVQ encoding. For the GVQ coding it is noted that some runs can exceed 1000 zeros. It will be noted that with the selected 10 bit field length the RUN length was intention limited to 1024.

Figure 12:
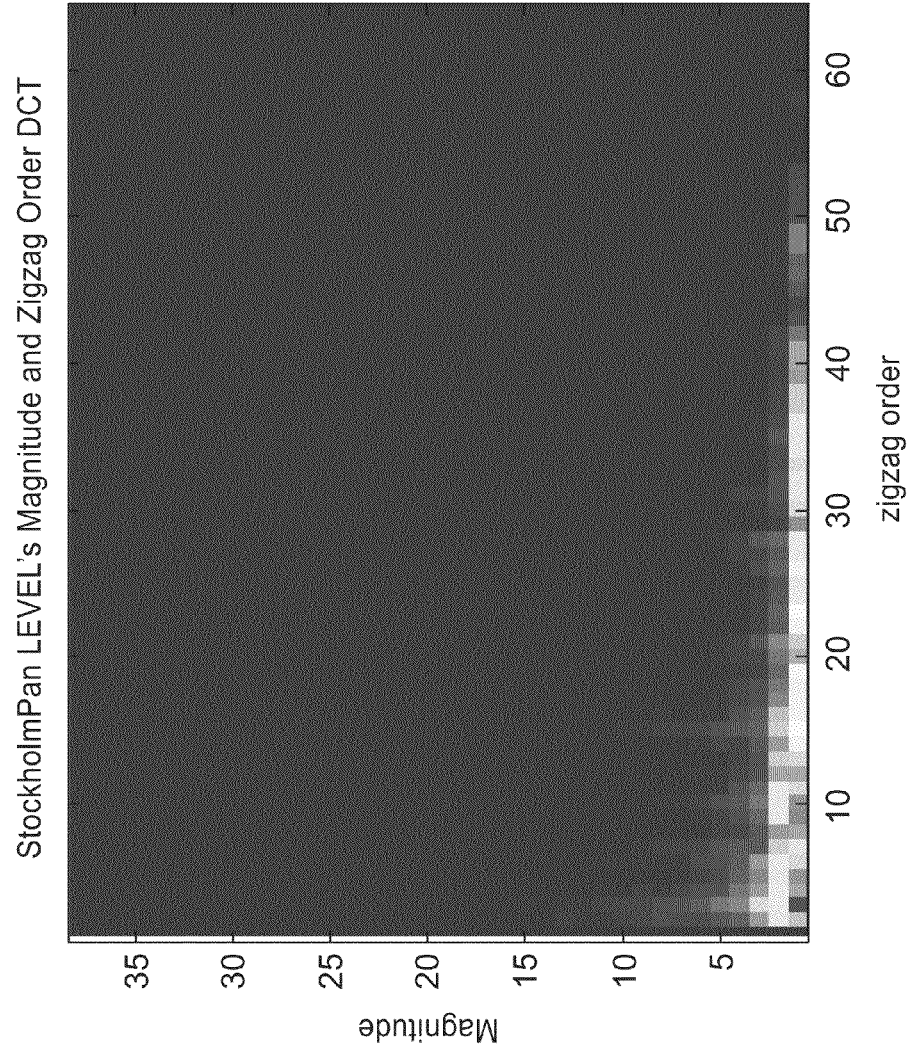
FIG. 12 are graphs of LEVEL magnitude and zig-zag order for DCT coding.

FIG. 12 depicts LEVEL magnitude and zig-zag order for DCT coding.

Figure 13:
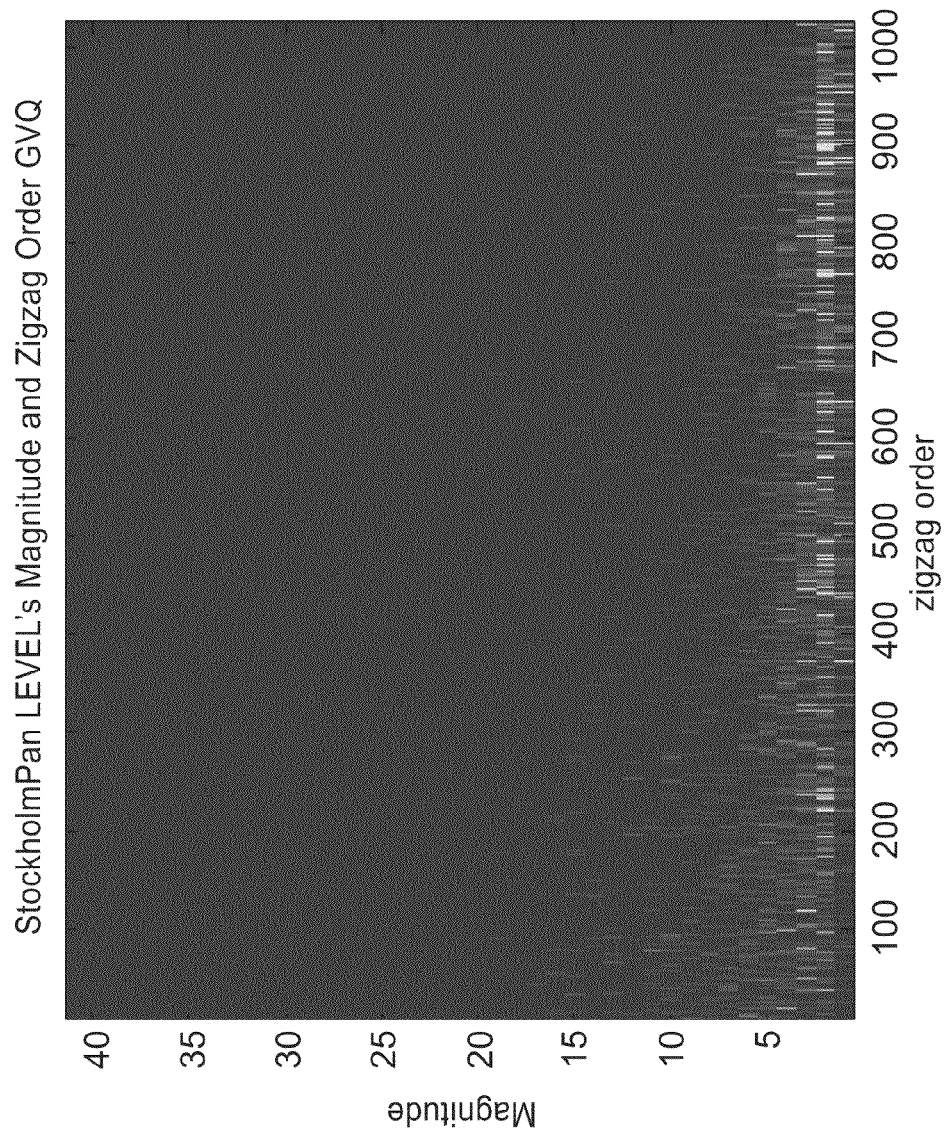
FIG. 13 are graphs of LEVEL magnitude and zig-zag order for GVQ coding according to one embodiment of the present invention.

FIG. 13 depicts LEVEL magnitude and zig-zag order for GVQ coding according to the present invention. It will be noted that the LEVEL magnitude distribution for GVQ in FIG. 13 is not as smooth as the LEVEL magnitude distribution for DCT in FIG. 12.

The present invention can be implemented in an image compression codec and may be utilized for Cameras, TVs and various video applications. The teachings of the present invention are particularly well suited for use in DCT-based image compression The issues addressed by the present invention provide for the coding of quantized transform coefficients using the run length technique with context modeling.

It should be appreciated that the present invention provides a number of benefits over other forms of encoding, and enhances sparse encoding using over-complete dictionaries. The present invention teaches novel use in quantizing coefficients in preparation for binarizing RLE symbols in response to defined context models.

It should also be recognized that the difficulty of coding coefficients of the image blocks in an over-complete transform is that the number of coefficients is larger than the original number of pixels. The present invention utilizes GVQ quantization which is particularly well suited for use with run length coding techniques which help reduce the effect of over-completeness. Moreover, atoms in the over-complete dictionaries (e.g., expressing geometric patterns, such as edge locations) do not have an ordering as in the case of DCT with its zigzag ordering, whereby the present invention is configured to order atoms in the dictionary based on their appearance frequency in the training process. Finally, it will be noted that the RUN and LEVEL of coefficients follows some defined probability, as exploited by the context modeling of bins.

From the foregoing description it can be seen that the present invention provides methods and apparatus for sparse image encoding. Inventive teachings can be applied in a variety of apparatus and applications, including image codecs, and other imaging apparatus. It will also be appreciated that the present invention includes the following inventive embodiments among others:

1. An apparatus for encoding image blocks from images, comprising: a sparse coder configured for geometric vector quantization of an image block, having a number of pixels, from an input image in response to selecting a pattern from a finite set of geometric patterns contained in a dictionary, and generating a number of coefficients within a vector of coefficients representing said image block; wherein the number of coefficients within said vector of coefficients exceeds the number of pixels in the image block in response to sparse decompositions of the image block arising from utilizing said dictionary which is over-complete; a run-length coder configured for converting said vector of coefficients to symbols which are arithmetically coded into a bit stream output.

2. An apparatus as recited in embodiment 1, wherein said finite set of geometric patterns are based on edge-related features detected in a training set.

3. An apparatus as recited in embodiment 1, wherein a higher percentage of zero coefficients are generated in response to said geometric vector quantization that arise when coding according to a discrete cosine transform (DCT).

4. An apparatus as recited in embodiment 1, wherein the finite set of geometric patterns are retained in the dictionary in response to frequency of appearance in the image block and not in response to an image signal frequency relationship.

5. An apparatus as recited in embodiment 1, wherein said dictionary is over-complete in which said finite set of geometric patterns exceeds the size of an image block.

6. An apparatus as recited in embodiment 1, wherein in response to said geometric vector quantization, DC value and RUN-LENGTH pairs generated by said run-length coder do not have a frequency relationships as provided by DCT.

7. An apparatus as recited in embodiment 1, wherein during said geometric vector quantization operation, a pattern is selected from the finite set of geometric patterns contained in the dictionary and utilized in generating a number of coefficients within a vector of coefficients representing said image block.

8. An apparatus as recited in embodiment 1, wherein the number of coefficients within said vector of coefficients exceeds the number of blocks within an image macro block in response to sparse decompositions of the image macro block arising from utilizing said dictionary which is over-complete.

9. An apparatus as recited in embodiment 1: wherein said run-length coder arithmetically codes the vector of coefficients into a bit stream output in response to switching between a plurality of context models; wherein said context model predicts non-zeros as a number of value N; wherein each said context model within said plurality of context models is utilized in binary arithmetic coding of a first N−1 RUN values; and wherein if prediction N is incorrect, a plurality of context models utilized for the first N−1 RUN values are also utilized for RUN values subsequent to N.

10. An apparatus for encoding image blocks from received images, comprising: a computer configured for encoding an image; and programming executable on said computer for performing steps comprising: dividing the image into a plurality of image blocks, each having a number of pixels; performing a geometric vector quantization operation on an image block within a plurality of image blocks in response to a finite set of geometric patterns contained within a dictionary, which is over-complete, to generate a sparse coding within a vector of coefficients; and converting said vector of coefficients to symbols, which are arithmetically coded into a bit stream output in response to switching between a plurality of context models.

11. An apparatus as recited in embodiment 10, wherein during said geometric vector quantization operation, a pattern is selected from the finite set of geometric patterns contained in the dictionary and utilized in generating a number of coefficients within a vector of coefficients representing said image block.

12. An apparatus as recited in embodiment 11, wherein the number of coefficients within said vector of coefficients exceeds the number of blocks within the image macro block in response to sparse decompositions of the image macro block arising from utilizing said dictionary which is over-complete.

13. An apparatus as recited in embodiment 10, wherein said finite set of geometric patterns are based on edge-related features detected in a training set.

14. An apparatus as recited in embodiment 13, wherein said dictionary comprises atoms which are ordered in response to their appearance frequency within a training process using the training set.

15. An apparatus as recited in embodiment 10, wherein a higher percentage of zero coefficients are generated in response to said geometric vector quantization operation than arise when coding according to a discrete cosine transform (DCT).

16. An apparatus as recited in embodiment 10: wherein during said geometric vector quantization operation a pattern selected from the finite set of geometric patterns contained in the dictionary, is utilized in generating a number of coefficients within a vector of coefficients representing said image block; and wherein the finite set of geometric patterns are retained in the dictionary in response to frequency of appearance in the image block and not in response to an image signal frequency relationship.

17. An apparatus as recited in embodiment 10: wherein an image block has a size; and wherein said dictionary is over-complete in which said finite set of geometric patterns exceeds the size of an image block.

18. A method of encoding image blocks from received images within an image encoding device, comprising: dividing an image into image blocks; performing geometric vector quantization on each image block in response to an over-complete dictionary to generate a sparse coding within a vector of coefficients; converting said vector of coefficients to symbols which are arithmetically coded into a bit stream output in response to switching between context models.

19. A method as recited in embodiment 18: wherein an image block has a size; and wherein said dictionary is over-complete because said finite set of geometric patterns exceeds the size of an image block.

20. A method as recited in embodiment 18, wherein said dictionary comprises atoms which are ordered in response to their appearance frequency determined within a training process.

Embodiments of the present invention are described with reference to flowchart illustrations of methods and systems according to embodiments of the invention. These methods and systems can also be implemented as computer program products. In this regard, each block or step of a flowchart, and combinations of blocks (and/or steps) in a flowchart, can be implemented by various means, such as hardware, firmware, and/or software including one or more computer program instructions embodied in computer-readable program code logic. As will be appreciated, any such computer program instructions may be loaded onto a computer, including without limitation a general purpose computer or special purpose computer, or other programmable processing apparatus to produce a machine, such that the computer program instructions which execute on the computer or other programmable processing apparatus create means for implementing the functions specified in the block(s) of the flowchart(s).

Accordingly, blocks of the flowcharts support combinations of means for performing the specified functions, combinations of steps for performing the specified functions, and computer program instructions, such as embodied in computer-readable program code logic means, for performing the specified functions. It will also be understood that each block of the flowchart illustrations, and combinations of blocks in the flowchart illustrations, can be implemented by special purpose hardware-based computer systems which perform the specified functions or steps, or combinations of special purpose hardware and computer-readable program code logic means.

Furthermore, these computer program instructions, such as embodied in computer-readable program code logic, may also be stored in a computer-readable memory that can direct a computer or other programmable processing apparatus to function in a particular manner, such that the instructions stored in the computer-readable memory produce an article of manufacture including instruction means which implement the function specified in the block(s) of the flowchart(s). The computer program instructions may also be loaded onto a computer or other programmable processing apparatus to cause a series of operational steps to be performed on the computer or other programmable processing apparatus to produce a computer-implemented process such that the instructions which execute on the computer or other programmable processing apparatus provide steps for implementing the functions specified in the block(s) of the flowchart(s).

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. An apparatus for encoding image blocks from images, comprising:
   a sparse coder configured for geometric vector quantization of an image block, having a number of pixels;
   wherein said geometric vector quantization approximates an input vector from an input image and is performed by selecting a pattern from a finite set of geometric patterns contained in a dictionary, and generating a number of coefficients within a vector of coefficients representing said image block;
   wherein said sparse coder utilizes said dictionary which is over-complete and trained to enforce sparsity to provide more frequent runs of zero coefficients;
   wherein although the number of coefficients within said vector of coefficients exceeds the number of pixels in said image block, said vector of coefficients is generated with more sparsity because of sparse decompositions of said image block resulting from utilizing said dictionary which is over-complete; and
   a run-length coder configured for converting said vector of coefficients to symbols which are arithmetically coded into a bit stream output.

2. An apparatus as recited in claim 1, wherein said finite set of geometric patterns are based on edge-related features detected in a training set.

3. An apparatus as recited in claim 1, wherein a higher percentage of zero coefficients are generated in response to said geometric vector quantization that arise when coding according to a discrete cosine transform (DCT).

4. An apparatus as recited in claim 1, wherein the finite set of geometric patterns are retained in the dictionary in response to frequency of appearance in the image block and not in response to an image signal frequency relationship.

5. An apparatus as recited in claim 1, wherein said dictionary is over-complete in which said finite set of geometric patterns exceeds the size of an image block.

6. An apparatus as recited in claim 1, wherein in response to said geometric vector quantization, DC value and RUN-LENGTH pairs generated by said run-length coder do not have a frequency relationships as provided by DCT.

7. An apparatus as recited in claim 1, wherein during said geometric vector quantization operation, a pattern is selected from the finite set of geometric patterns contained in the dictionary and utilized in generating a number of coefficients within a vector of coefficients representing said image block.

8. An apparatus as recited in claim 1, wherein the number of coefficients within said vector of coefficients exceeds the number of blocks within an image macro block in response to sparse decompositions of the image macro block arising from utilizing said dictionary which is over-complete.

9. An apparatus as recited in claim 1:
   wherein said run-length coder arithmetically codes the vector of coefficients into a bit stream output in response to switching between a plurality of context models;

wherein said context model predicts non-zeros as a number of value N;

wherein each said context model within said plurality of context models is utilized in binary arithmetic coding of a first N−1 RUN values; and wherein if prediction N is incorrect, a plurality of context models utilized for the first N−1 RUN values are also utilized for RUN values subsequent to N.

10. An apparatus for encoding image blocks from received images, comprising:

a computer configured for encoding an image; and programming executable on said computer for performing steps comprising:

dividing the image into a plurality of image blocks, each having a number of pixels;

performing a geometric vector quantization operation on an image block within the plurality of image blocks in response to a finite set of geometric patterns contained within a dictionary, which is over-complete, to generate a sparse coding, with more frequent runs of zero coefficients, within a vector of coefficients; and converting said vector of coefficients to symbols, which are arithmetically coded into a bit stream output in response to switching between a plurality of context models.

11. An apparatus as recited in claim 10, wherein during said geometric vector quantization operation, a pattern is selected from the finite set of geometric patterns contained in the dictionary and utilized in generating a number of coefficients within a vector of coefficients representing said image block.

12. An apparatus as recited in claim 11, wherein the number of coefficients within said vector of coefficients exceeds the number of pixels in said image block, said vector of coefficients is generated as more sparse because of sparse decompositions of said image block resulting from utilizing said dictionary which is over-complete.

13. An apparatus as recited in claim 10, wherein said finite set of geometric patterns are based on edge-related features detected in a training set.

14. An apparatus as recited in claim 13, wherein said dictionary comprises atoms which are ordered in response to their appearance frequency within a training process using the training set.

15. An apparatus as recited in claim 10, wherein a higher percentage of zero coefficients are generated in response to said geometric vector quantization operation than arise when coding according to a discrete cosine transform (DCT).

16. An apparatus as recited in claim 10:

wherein during said geometric vector quantization operation a pattern selected from the finite set of geometric patterns contained in the dictionary, is utilized in generating a number of coefficients within a vector of coefficients representing said image block; and wherein the finite set of geometric patterns are retained in the dictionary in response to frequency of appearance in the image block and not in response to an image signal frequency relationship.

17. An apparatus as recited in claim 10:

wherein an image block has a size; and wherein said dictionary is over-complete in which said finite set of geometric patterns exceeds the size of an image block.

18. A method of encoding image blocks from received images within an image encoding device, comprising:

dividing an image into image blocks;

performing geometric vector quantization on each image block in response to an over-complete dictionary to generate a sparse coding within a vector of coefficients;

wherein said sparse coding utilizes said over-complete dictionary to enforce sparsity resulting in more frequent runs of zero coefficients; and converting said vector of coefficients to symbols which are arithmetically coded into a bit stream output in response to switching between context models.

19. A method as recited in claim 18:

wherein an image block has a size; and wherein said dictionary is over-complete because said finite set of geometric patterns exceeds the size of an image block.

20. A method as recited in claim 18, wherein said dictionary comprises atoms which are ordered in response to their appearance frequency determined within a training process.

* * * * *